(12) United States Patent
Matsushima et al.

(10) Patent No.: US 12,224,386 B2
(45) Date of Patent: Feb. 11, 2025

(54) ULTRAVIOLET LIGHT EMITTING DEVICE

(71) Applicant: TOYODA GOSEI CO., LTD., Kiyosu (JP)

(72) Inventors: Takeshi Matsushima, Kiyosu (JP); Shota Shimonishi, Kiyosu (JP); Kenichi Matsuura, Kiyosu (JP); Aya Kawaoka, Kiyosu (JP); Takashi Shugo, Kiyosu (JP); Shintaro Hakamata, Kiyosu (JP); Yuki Goto, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 468 days.

(21) Appl. No.: 17/573,915

(22) Filed: Jan. 12, 2022

(65) Prior Publication Data
US 2022/0231205 A1    Jul. 21, 2022

(30) Foreign Application Priority Data
Jan. 15, 2021 (JP) .................... 2021-004905

(51) Int. Cl.
*H01L 33/56* (2010.01)
*H01L 33/62* (2010.01)

(52) U.S. Cl.
CPC ............. *H01L 33/56* (2013.01); *H01L 33/62* (2013.01)

(58) Field of Classification Search
CPC ............... G11B 5/7253; H01M 50/426; A61B 2017/00853; C08J 2327/18; C08J 2427/18;
(Continued)

(56) References Cited

U.S. PATENT DOCUMENTS

2007/0267645 A1   11/2007  Nakata et al.
2012/0074434 A1*   3/2012  Park .................. H01L 33/56
                                                   257/E33.072
(Continued)

FOREIGN PATENT DOCUMENTS

CN      111200049 A      5/2020
JP      2007-311707 A    11/2007
JP      2016-207754 A    12/2016

OTHER PUBLICATIONS

Japanese Office Action dated Sep. 19, 2023, in corresponding Japanese Patent Application No. 2021-004905, with an English translation thereof.

*Primary Examiner* — Galina G Yushina
(74) *Attorney, Agent, or Firm* — MCGINN I.P. LAW GROUP, PLLC

(57) ABSTRACT

An ultraviolet light emitting device includes a substrate, an ultraviolet light emitting element, a bonding layer, a fluororesin film, and a fluorocarbon compound. The substrate includes a mounting surface. The ultraviolet light emitting element includes a first surface, a second surface, and a side surface. The bonding layer bonds the electrode on the first surface of the ultraviolet light emitting element and a part of the mounting surface of the substrate. The fluororesin film is a flexible material configured to transmit ultraviolet light. The substrate and the fluororesin film are disposed in a state where the ultraviolet light emitting element is sandwiched therebetween. The fluorocarbon compound is a liquid at normal temperature and pressure. The fluorocarbon compound fills a gap between the side surface of the ultraviolet light emitting element and the fluororesin film in a state of being in contact with the side surface and the fluororesin film.

20 Claims, 4 Drawing Sheets

(58) Field of Classification Search
CPC ....... H01L 33/56; H01L 33/62; H01L 33/486; H01L 33/58
See application file for complete search history.

(56) References Cited

U.S. PATENT DOCUMENTS

| | | | |
|---|---|---|---|
| 2014/0239328 A1* | 8/2014 | Lee | H01L 33/58 |
| | | | 257/98 |
| 2021/0050483 A1* | 2/2021 | Bilenko | H01L 33/56 |
| 2021/0217936 A1* | 7/2021 | Shi | H01L 33/56 |
| 2022/0328729 A1* | 10/2022 | Lunev | H01L 33/58 |

* cited by examiner

ULTRAVIOLET LIGHT EMITTING DEVICE

CROSS-REFERENCE TO RELATED APPLICATIONS

This application is based on and claims priority under 35 USC 119 from Japanese Patent Application No. 2021-004905 filed on Jan. 15, 2021.

TECHNICAL FIELD

The technical field of the present specification relates to an ultraviolet light emitting device including an ultraviolet light emitting element.

BACKGROUND ART

In a light emitting device which emits visible light, a semiconductor light emitting element mounted on a substrate is sealed with a resin. The sealing resin is, for example, a silicone resin or an epoxy resin. A refractive index of these resins is greater than a refractive index of the atmosphere. Therefore, reflection at an interface between the semiconductor light emitting element and the sealing resin is prevented. That is, light extraction efficiency is high.

In recent years, a light emitting device using an ultraviolet light emitting element has been researched and developed. Ultraviolet light degenerates the silicone resin and the epoxy resin. The resin cured or deteriorated by the ultraviolet light causes cracks. Therefore, an ultraviolet light emitting device which does not use a silicone resin or an epoxy resin has been developed. For example, JP-A-2007-311707 discloses a technique of using a fluororesin as a refractive index difference alleviating substance 20 directly above an ultraviolet light emitting element (paragraph [0025] in JP-A-2007-311707). Accordingly, the difference in refractive index between the ultraviolet light emitting element having a refractive index of about 1.7 and the atmosphere having a refractive index of 1 is alleviated.

Some ultraviolet light emitting devices cover a periphery of the ultraviolet light emitting element with a resin film. The resin film is flexible and deforms according to an outer shape of the ultraviolet light emitting element. In this case, a gap is generated between the ultraviolet light emitting element and the resin film There is air in this gap. Since the difference in refractive index between the ultraviolet light emitting element and air is large, a critical angle for total internal reflection is small. That is, the light emitted from the ultraviolet light emitting element is likely to cause total internal reflection at a boundary with air.

The light extraction efficiency of this ultraviolet light emitting device tends to be low. Therefore, even when the resin film is used, it is preferable to alleviate the difference in refractive index to improve the light extraction efficiency.

SUMMARY OF INVENTION

An object of the present specification is to provide an ultraviolet light emitting device covered with a resin film and having high light extraction efficiency.

An ultraviolet light emitting device according to a first aspect includes: a substrate; an ultraviolet light emitting element; a bonding layer; a fluororesin film; and a fluorocarbon compound. The substrate includes a mounting surface mounting the ultraviolet light emitting element. The ultraviolet light emitting element has a first surface having an electrode, a second surface opposite to the first surface, and a side surface. The bonding layer bonds the electrode on the first surface of the ultraviolet light emitting element and a part of the mounting surface of the substrate. The fluororesin film is a flexible material configured to transmit ultraviolet light. The substrate and the fluororesin film are disposed in a state where the ultraviolet light emitting element is sandwiched therebetween. The fluorocarbon compound is a liquid at normal temperature and pressure. The fluorocarbon compound fills a gap between the side surface of the ultraviolet light emitting element and the fluororesin film in a state of being in contact with the side surface and the fluororesin film.

In this ultraviolet light emitting device, the gap between the side surface of the ultraviolet light emitting element and the resin film is filled with the fluorocarbon compound. Therefore, the side surface of the ultraviolet light emitting element is not in contact with air. Therefore, there is no concern that the light emitted from the ultraviolet light emitting element is reflected at an interface between the ultraviolet light emitting element and air. Therefore, this ultraviolet light emitting device has high output.

In the present specification, it is possible to provide an ultraviolet light emitting device covered with a resin film and having high light extraction efficiency.

DESCRIPTION OF EMBODIMENTS

Hereinafter, specific embodiments will be described with reference to the drawings, taking an ultraviolet light emitting device as an example. However, the technique of the present specification is not limited to the embodiments. A structure different from that of the embodiments may be included. The thickness ratio of each layer in each figure is conceptually shown, and does not indicate the actual thickness ratio.

First Embodiment

1. Light Emitting Device

Figure 1:
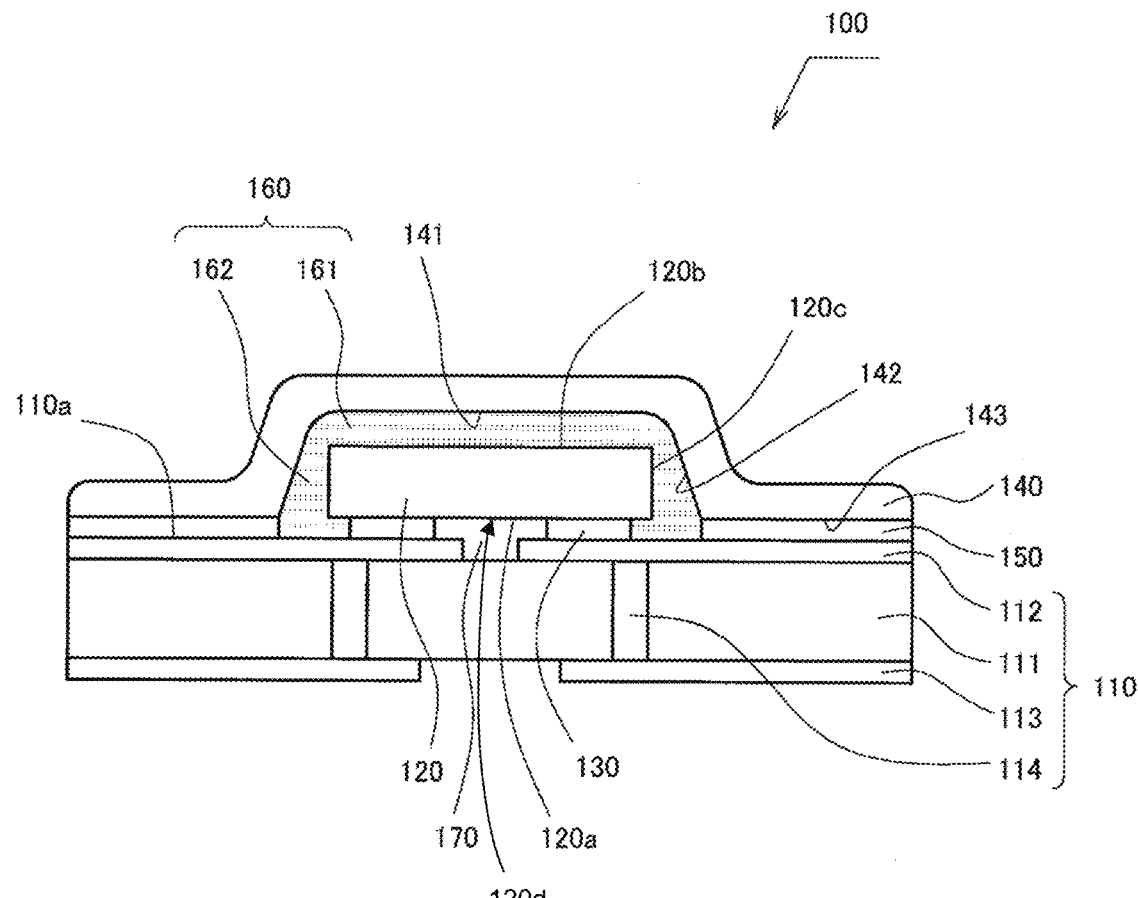
FIG. 1 is a schematic configuration diagram of a light emitting device 100 according to a first embodiment.

FIG. 1 is a schematic configuration diagram of a light emitting device 100 according to a first embodiment. As illustrated in FIG. 1, the light emitting device 100 includes a substrate 110, an ultraviolet light emitting element 120, a bonding layer 130, a fluororesin film 140, an adhesive layer 150, a fluorocarbon compound 160, and an air layer 170. The light emitting device 100 is an ultraviolet light emitting device which emits ultraviolet light.

The substrate 110 is a substrate mounting an ultraviolet light emitting element 120. The substrate 110 has a mounting surface 110a. The mounting surface 110a is a surface mounting the ultraviolet light emitting element 120. The substrate 110 includes a base material 111, circuit patterns 112 and 113, and a through hole 114. The circuit pattern 112 is a pattern on a mounting surface 110a side in the substrate 110. The circuit pattern 113 is a pattern on a side opposite to the mounting surface 110a side in the substrate 110. The through hole 114 electrically connects the circuit pattern 112 and the circuit pattern 113. The through hole 114 is filled with a metal. The mounting surface 110a is a surface of the circuit pattern 112.

The ultraviolet light emitting element 120 is a semiconductor light emitting element which emits ultraviolet light. An emission wavelength of the ultraviolet light emitting element 120 is, for example, 200 nm or more and 320 nm or less. The ultraviolet light emitting element 120 is mounted on the substrate 110 via the bonding layer 130. The ultraviolet light emitting element 120 has a first surface 120a, a second surface 120b, and a side surface 120c. The first surface 120a has an electrode 120d. The first surface 120a faces the mounting surface 110a of the substrate 110. The second surface 120b is a surface opposite to the first surface 120a. The second surface 120b is a light extraction surface which extracts light to the outside of the ultraviolet light emitting element 120. The second surface 120b faces the fluororesin film 140. The side surface 120c is a surface other than the first surface 120a and the second surface 120b.

The bonding layer 130 is a layer mounting the ultraviolet light emitting element 120 on the substrate 110. The bonding layer 130 bonds the electrode on the first surface 120a of the ultraviolet light emitting element 120 and the circuit pattern 112 of the mounting surface 110a of the substrate 110. The material of the bonding layer 130 is, for example, an Au—Sn solder.

The fluororesin film 140 is a translucent fluororesin film for suitably extracting ultraviolet light emitted from the ultraviolet light emitting element 120 to the outside. The fluororesin film 140, of course, transmits ultraviolet light. The fluororesin film 140 is a flexible material which can be bent. The fluororesin film 140 is adhered to the substrate 110 in a bent state. The fluororesin film 140 is, for example, FEP. The fluororesin film 140 has a refractive index higher than the refractive index of the atmosphere. The refractive index of the fluororesin film 140 is, for example, 1.2 or more and 1.6 or less.

The fluororesin film 140 has a ceiling surface 141, a side wall surface 142, and a flat surface 143 on a substrate 110 side. The ceiling surface 141 faces the second surface 120b of the ultraviolet light emitting element 120. The side wall surface 142 faces the side surface 120c of the ultraviolet light emitting element 120. The flat surface 143 is in contact with the adhesive layer 150. The flat surface 143 is adhered to the substrate 110 via the adhesive layer 150.

The adhesive layer 150 adheres the substrate 110 and the fluororesin film 140. The substrate 110 and the fluororesin film 140 are disposed in a state where the ultraviolet light emitting element 120 is sandwiched therebetween. The adhesive layer 150 bonds the substrate 110 and the fluororesin film 140 in this state. The adhesive layer 150 adheres the mounting surface 110a of the substrate 110 and the fluororesin film 140. The adhesive layer 150 is not present between the second surface 120b of the ultraviolet light emitting element 120 and the fluororesin film 140.

The fluorocarbon compound 160 is located between the ultraviolet light emitting element 120 and the fluororesin film 140.

The air layer 170 is a closed space located between the substrate 110 and the ultraviolet light emitting element 120. The air layer 170 is filled with a gas. The gas is, for example, atmosphere. The air layer 170 is located between the mounting surface 110a of the substrate 110 and the first surface 120a of the ultraviolet light emitting element 120. There is no air layer either between the second surface 120b of the ultraviolet light emitting element 120 and the fluororesin film 140 or between the side surface 120c of the ultraviolet light emitting element 120 and the fluororesin film 140.

2. Fluorocarbon Compound
2-1. Region of Fluorocarbon Compound

The fluorocarbon compound 160 is a polymer having a CF bond. The fluorocarbon compound 160 is a liquid at normal temperature and pressure. The number of carbon atoms in the fluorocarbon compound 160 is 1.9 times or less the number of fluorine atoms in the fluorocarbon compound 160. The fluorocarbon compound 160 is, for example, perfluoropolyether (PFPE). The fluorocarbon compound 160 may have a refractive index greater than that of the atmosphere, and equal to or less than that of the ultraviolet light emitting element 120. The refractive index of the fluorocarbon compound 160 is, for example, 1.2 or more and 1.6 or less.

As illustrated in FIG. 1, the fluorocarbon compound 160 fills a gap either between the second surface 120b of the ultraviolet light emitting element 120 and the fluororesin film 140 or between the side surface 120c of the ultraviolet light emitting element 120 and the fluororesin film 140 in a state where the second surface 120b and the side surface 120c of the ultraviolet light emitting element 120 are in contact with the fluororesin film 140.

The fluorocarbon compound 160 has an upper surface portion 161 and a side surface portion 162. The upper surface portion 161 and the side surface portion 162 are connected to each other. The upper surface portion 161 faces the second surface 120b of the ultraviolet light emitting element 120. The side surface portion 162 faces the side surface 120c of the ultraviolet light emitting element 120.

The upper surface portion 161 is a region sandwiched between the second surface 120b of the ultraviolet light emitting element 120 and the ceiling surface 141 of the fluororesin film 140. The upper surface portion 161 has a rectangular parallelepiped shape. Vertical and horizontal lengths of the rectangular parallelepiped shape are equal to vertical and horizontal lengths of the ultraviolet light emitting element 120.

The side surface portion 162 is a region surrounded by the side surface 120c of the ultraviolet light emitting element 120, the side wall surface 142 of the fluororesin film 140, and the mounting surface 110a of the substrate 110. The side surface portion 162 is in contact with the side surface 120c of the ultraviolet light emitting element 120, the side wall surface 142 of the fluororesin film 140, and the mounting surface 110a of the substrate 110. The side surface portion 162 surrounds a periphery of the ultraviolet light emitting element 120. The side surface portion 162 has an annular shape.

A thickness of the side surface portion 162 of the fluorocarbon compound 160 in contact with the side surface 120c of the ultraviolet light emitting element 120 decreases as a distance from the mounting surface 110a of the substrate 110 increases.

The ceiling surface 141 of the fluororesin film 140 faces the second surface 120b of the ultraviolet light emitting element 120 in a state where the upper surface portion 161 of the fluorocarbon compound 160 is sandwiched therebetween. The side wall surface 142 of the fluororesin film 140 faces the side surface 120c of the ultraviolet light emitting element 120 in a state where the side surface portion 162 of the fluorocarbon compound 160 is sandwiched therebetween.

The fluorocarbon compound 160 does not fill a gap between the mounting surface 110a of the substrate 110 and the first surface 120a of the ultraviolet light emitting element 120.

2-2. Effect of Fluorocarbon Compound

The fluorocarbon compound 160 covers the second surface 120b and the side surface 120c of the ultraviolet light emitting element 120. The refractive index of the fluorocarbon compound 160 is greater than the refractive index of the atmosphere and equal to or less than the refractive index of the ultraviolet light emitting element 120. Therefore, the light to be emitted from the second surface 120b and the side surface 120c of the ultraviolet light emitting element 120 is less likely to be totally reflected at a boundary surface with the fluorocarbon compound 160. That is, the light extraction efficiency on the second surface 120b and the side surface 120c of the ultraviolet light emitting element 120 is high.

3. Refractive Index

The ultraviolet light emitting element 120 has a refractive index of about 1.7. The fluorocarbon compound 160 has a refractive index of about 1.2 or more and 1.6 or less. The fluororesin film 140 has a refractive index of about 1.2 or more and 1.6 or less. The atmosphere has a refractive index of 1. The refractive index of the fluorocarbon compound 160 is preferably greater than the refractive index of the fluororesin film 140. The ultraviolet light emitting element 120, the fluorocarbon compound 160, and the fluororesin film 140 have a higher refractive index in this descending order. In this case, total reflection is less likely to occur at the boundary between the materials.

In the first embodiment, the second surface 120b and the side surface 120c of the ultraviolet light emitting element 120 are not in contact with the air layer 170. As described above, the refractive index of the ultraviolet light emitting element 120 is sufficiently greater than the refractive index of the air layer 170. Since in the ultraviolet light emitting element 120, the second surface 120b and the side surface 120c from which the light is extracted to the outside are not in contact with the air layer 170 having a lower refractive index, the light from the ultraviolet light emitting element 120 is likely to be emitted to the outside of the element. Therefore, the light extraction efficiency of the light emitting device 100 is high.

3. Production Method 3-1. Element Mounting Step

Figure 2:
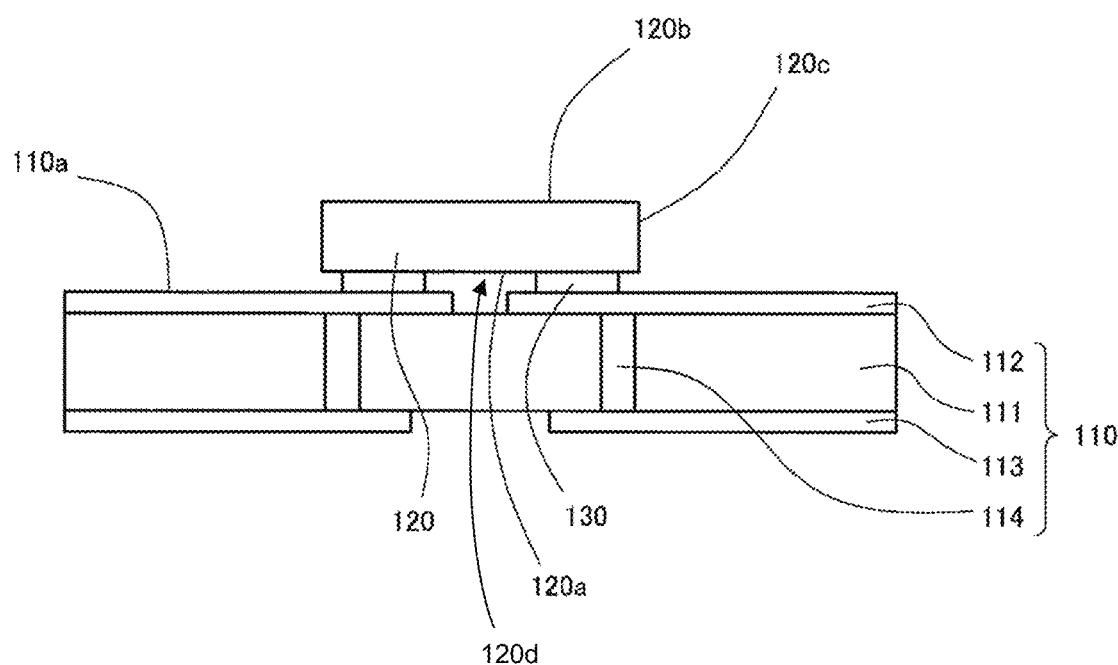
FIG. 2 is a diagram (part 1) illustrating a method for producing the light emitting device 100 according to the first embodiment.

As illustrated in FIG. 2, the ultraviolet light emitting element 120 is mounted on the mounting surface 110a of the substrate 110. A solder is placed on the mounting surface 110a of the substrate 110. The ultraviolet light emitting element 120 is placed on the solder such that the electrode 120d on the first surface 120a of the ultraviolet light emitting element 120 is in contact with the solder. Then, the ultraviolet light emitting element 120 is mounted on the substrate 110 by, for example, reflow.

3-2. Fluorocarbon Compound Supply Step

Figure 3:
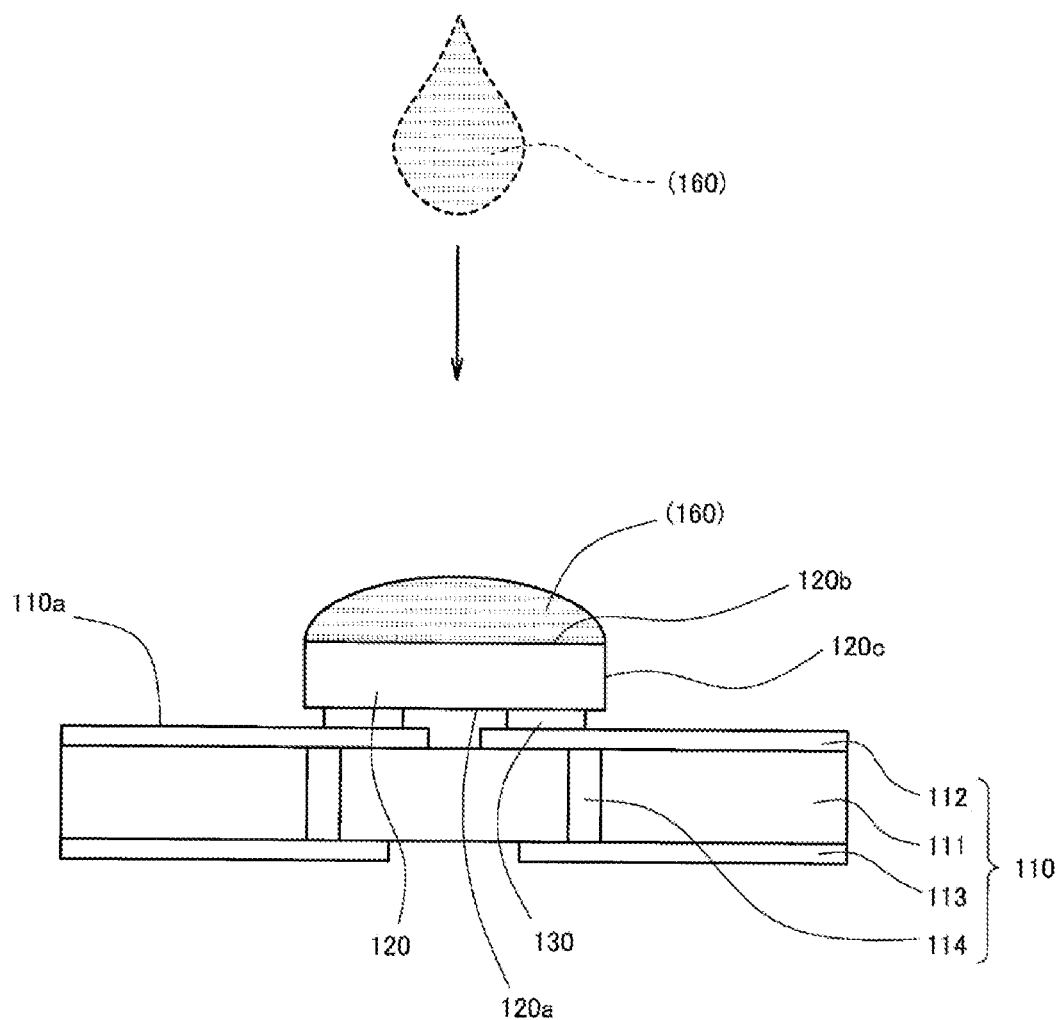
FIG. 3 is a diagram (part 2) illustrating the method for producing the light emitting device 100 according to the first embodiment.

As illustrated in FIG. 3, the fluorocarbon compound 160 is supplied to the second surface 120b and the side surface 120c of the ultraviolet light emitting element 120. At this stage, the fluorocarbon compound 160 is not in contact with the side surface 120c of the ultraviolet light emitting element 120.

3-3. Adhering Step

Figure 4:
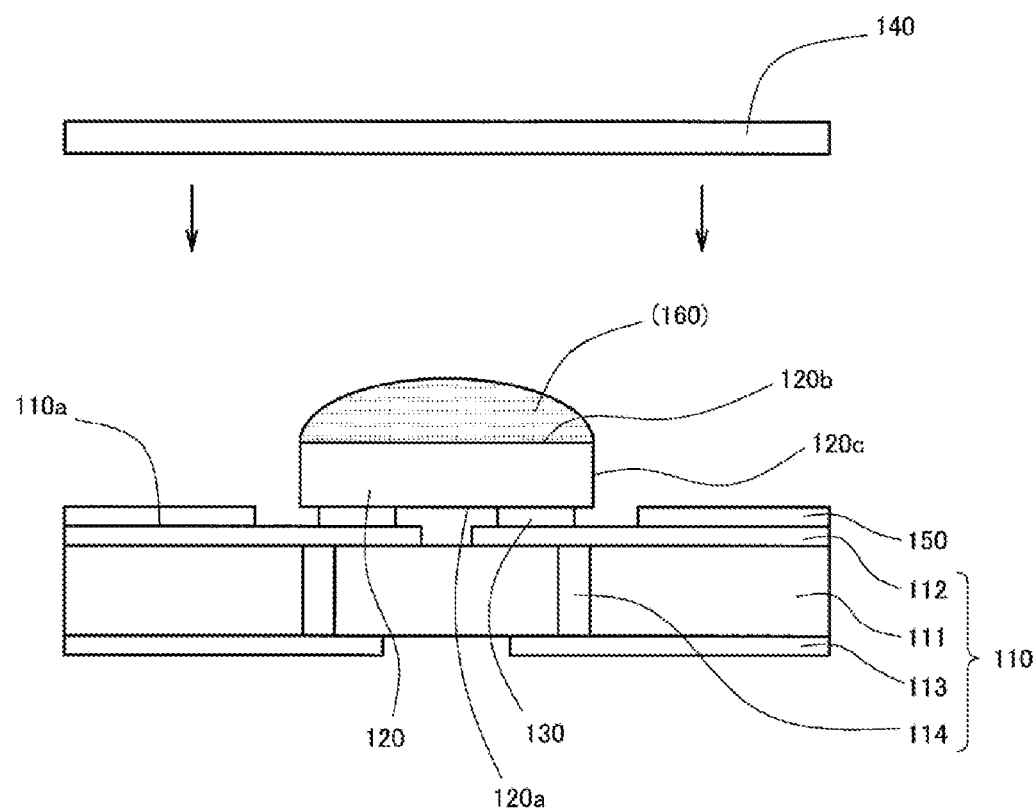
FIG. 4 is a diagram (part 3) illustrating the method for producing the light emitting device 100 according to the first embodiment.

As illustrated in FIG. 4, the adhesive layer 150 is coated onto the mounting surface 110a of the substrate 110. Thereafter, the fluororesin film 140 is bent and adhered to the mounting surface 110a of the substrate 110. Accordingly, the light emitting device 100 is produced.

4. Effect of First Embodiment

The fluorocarbon compound 160 covers the second surface 120b and the side surface 120c of the ultraviolet light emitting element 120. Therefore, the light to be emitted to the outside from the second surface 120b and the side surface 120c of the ultraviolet light emitting element 120 is less likely to be totally reflected at the boundary surface with the fluorocarbon compound 160. That is, the light extraction efficiency on the second surface 120b and the side surface 120c of the ultraviolet light emitting element 120 is high.

5. Modifications 5-1. Fluorocarbon Compound

Figure 5:
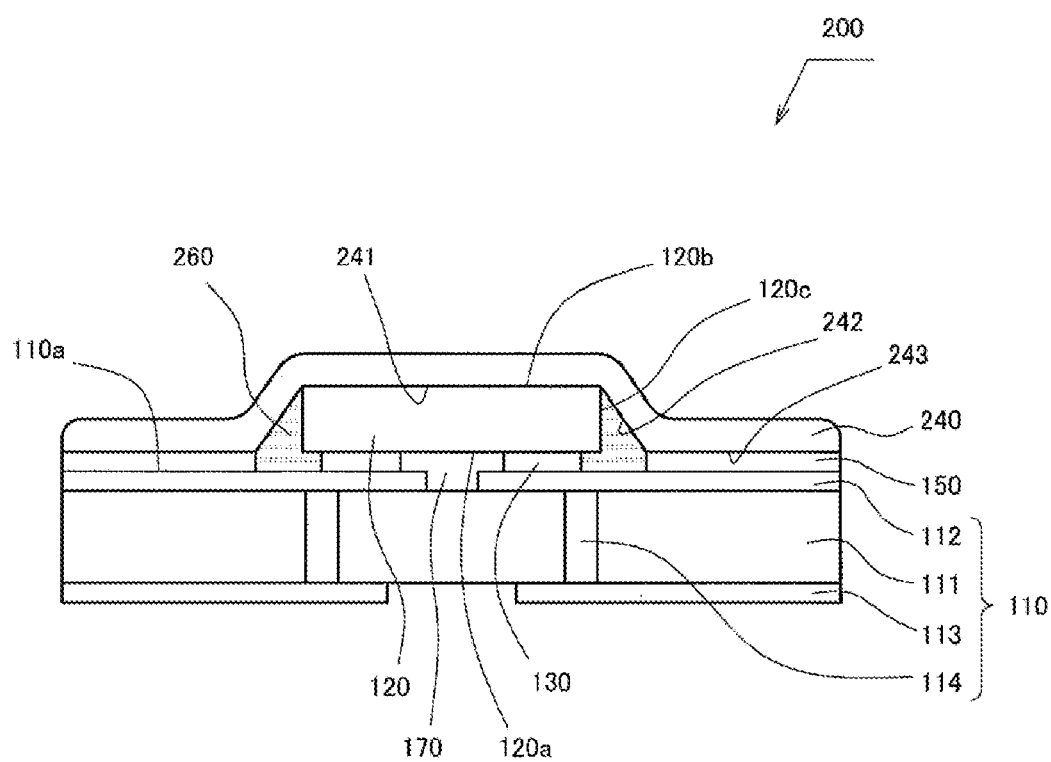
FIG. 5 is a schematic configuration diagram of a light emitting device 200 according to a modification of the first embodiment.

FIG. 5 is a schematic configuration diagram of a light emitting device 200 according to a modification of the first embodiment. The light emitting device 200 includes the substrate 110, the ultraviolet light emitting element 120, the bonding layer 130, a fluororesin film 240, the adhesive layer 150, a fluorocarbon compound 260, and the air layer 170.

The fluororesin film 240 has a ceiling surface 241, an inclined surface 242, and a flat surface 243 on the substrate 110 side. The ceiling surface 241 of the fluororesin film 240 is in contact with the second surface 120b of the ultraviolet light emitting element 120, and is not in contact with the fluorocarbon compound 260. That is, there is no gap between the ceiling surface 241 of the fluororesin film 240 and the second surface 120b of the ultraviolet light emitting element 120, and the fluorocarbon compound 260 filling the gap is not present.

Even in this case, the light from the ultraviolet light emitting element 120 is suitably incident on the fluororesin film 240. That is, the light is suitably extracted from the ultraviolet light emitting element 120.

In order to produce the light emitting device 200, a force for pressing the fluororesin film 140 against the ultraviolet light emitting element 120 may be increased.

5-2. Air Layer

Figure 6:
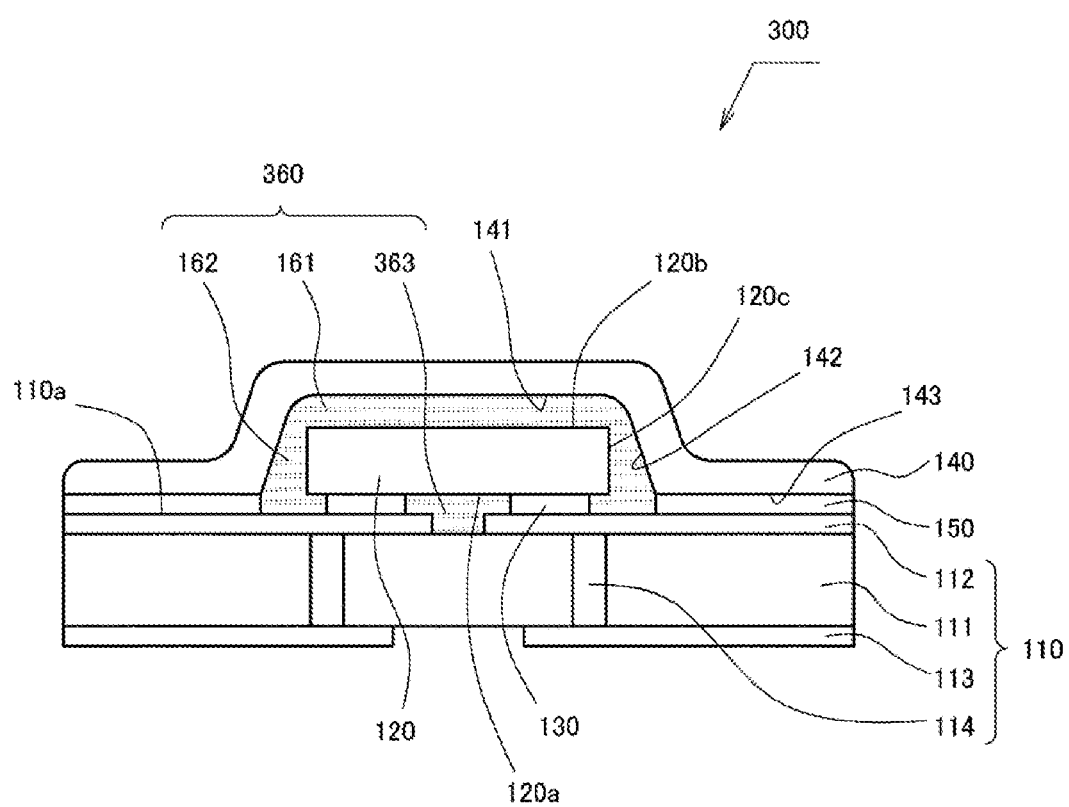
FIG. 6 is a schematic configuration diagram of a light emitting device 300 according to a modification of the first embodiment.

FIG. 6 is a schematic configuration diagram of a light emitting device 300 according to a modification of the first embodiment. The light emitting device 300 includes the substrate 110, the ultraviolet light emitting element 120, the bonding layer 130, the fluororesin film 140, the adhesive layer 150, and a fluorocarbon compound 360.

The light emitting device 300 does not have an air layer between the mounting surface 110a of the substrate 110 and the first surface 120a of the ultraviolet light emitting element 120. Instead, the fluorocarbon compound 360 fills the gap between the mounting surface 110a of the substrate 110 and the first surface 120a of the ultraviolet light emitting element 120.

Even in this case, the light from the ultraviolet light emitting element 120 is transmitted through the fluorocarbon compound 360 and then suitably incident on the fluororesin film 140. That is, the light is suitably extracted from the ultraviolet light emitting element 120.

In order to produce the light emitting device 300, the amount of the fluorocarbon compound 360 supplied to the second surface 120b of the ultraviolet light emitting element 120 may be increased. The fluorocarbon compound 360 may spill out from the second surface 120b of the ultraviolet light emitting element 120 and spread to some extent to the mounting surface 110a of the substrate 110. Alternatively, the fluorocarbon compound 360 may be separately supplied to the periphery of the bonding layer 130 by underfill.

5-3. Filler

The fluorocarbon compound 160 may contain a filler which transmits ultraviolet light. The material of the filler is, for example, fluorine powder or silica. The filler may have a refractive index about the same as the refractive index of the fluorocarbon compound 160. The refractive index of the filler is, for example, 1.2 or more and 1.6 or less. The filler has a particle diameter of, for example, 20 nm or more and 50 μm or less. An abundance ratio of the filler in the fluorocarbon compound 160 is, for example, 0.1 wt % or more and 50 wt % or less.

When the filler is a material which does not contain fluorine, such as silica, the filler may absorb ultraviolet light. In this case, the particle diameter of the filler may be smaller than a peak value of the emission wavelength of the ultraviolet light emitting element 120. The filler has a particle diameter of, for example, 20 nm or more and 100 nm or less.

The filler is suitable for adjusting a static viscosity and a kinematic viscosity of the fluorocarbon compound 160. That is, the kinematic viscosity is preferably low so as to facilitate dropping. It is preferable to use a value of the static viscosity such that the side surface portion 162 maintains a suitable shape after the fluorocarbon compound 160 drips on the side surface 120c of the ultraviolet light emitting element 120.

5-4. Ceiling Surface

The ceiling surface 141 is a plane parallel to the mounting surface 110a of the substrate 110. However, the ceiling surface 141 may not be parallel to the mounting surface 110a of the substrate 110. The ceiling surface 141 may be a curved surface.

5-5. Adhesive Surface

The fluororesin film 140 may have an adhesive surface coated with an adhesive on the substrate 110 side. In this case, the adhesive on the adhesive surface is disposed between fluororesin film 140 and fluorocarbon compound 160. The area where the adhesive on the adhesive surface comes into contact with the fluorocarbon compound 160 is large. Therefore, as illustrated in FIG. 1, it is preferable that the adhesive is present only on the mounting surface 110a of the substrate 110.

5-6. Combination

The above modifications may be freely combined.

APPENDIX

An ultraviolet light emitting device according to a first aspect includes: a substrate; an ultraviolet light emitting element; a bonding layer; a fluororesin film; and a fluorocarbon compound. The substrate includes a mounting surface mounting the ultraviolet light emitting element. The ultraviolet light emitting element has a first surface having an electrode, a second surface opposite to the first surface, and a side surface. The bonding layer bonds the electrode on the first surface of the ultraviolet light emitting element and a part of the mounting surface of the substrate. The fluororesin film is a flexible material configured to transmit ultraviolet light. The substrate and the fluororesin film are disposed in a state where the ultraviolet light emitting element is sandwiched therebetween. The fluorocarbon compound is a liquid at normal temperature and pressure. The fluorocarbon compound fills a gap between the side surface of the ultraviolet light emitting element and the fluororesin film in a state of being in contact with the side surface and the fluororesin film.

In the ultraviolet light emitting device according to a second aspect, the fluorocarbon compound includes a side surface portion facing the side surface of the ultraviolet light emitting element. The fluororesin film includes a side wall surface on a substrate side. The side wall surface of the fluororesin film faces the side surface of the ultraviolet light emitting element in a state where the side surface portion of the fluorocarbon compound is sandwiched therebetween.

In the ultraviolet light emitting device according to a third aspect, a thickness of the side surface portion of the fluorocarbon compound is smaller as a distance from the mounting surface of the substrate increases.

In the ultraviolet light emitting device according to a fourth aspect, the fluorocarbon compound includes an upper surface portion facing the second surface of the ultraviolet light emitting element. The fluororesin film includes a ceiling surface on the substrate side. The ceiling surface of the fluororesin film faces the second surface of the ultraviolet light emitting element in a state where the upper surface portion of the fluorocarbon compound is sandwiched therebetween.

In the ultraviolet light emitting device according to a fifth aspect, the fluororesin film includes a ceiling surface on the substrate side. The ceiling surface of the fluororesin film is in contact with the second surface of the ultraviolet light emitting element.

In the ultraviolet light emitting device according to a sixth aspect, the fluorocarbon compound fills a gap between the mounting surface of the substrate and the first surface of the ultraviolet light emitting element.

In the ultraviolet light emitting device according to a seventh aspect, the fluorocarbon compound does not fill a gap between the mounting surface of the substrate and the first surface of the ultraviolet light emitting element.

In the ultraviolet light emitting device according to an eighth aspect, the fluorocarbon compound contains a filler configured to transmit ultraviolet light. The filler has a refractive index of 1.2 or more and 1.6 or less.

The ultraviolet light emitting device according to a ninth aspect further includes an adhesive layer. The adhesive layer adheres the mounting surface of the substrate and the fluororesin film, and is not present between the second surface of the ultraviolet light emitting element and the fluororesin film.

What is claimed is:

1. An ultraviolet light emitting device comprising:
   a substrate;
   an ultraviolet light emitting element;
   a bonding layer;
   a fluororesin film; and
   a fluorocarbon compound, wherein:
   the substrate includes a mounting surface mounting the ultraviolet light emitting element;
   the ultraviolet light emitting element includes a first surface having an electrode, a second surface opposite to the first surface, and a side surface;
   the bonding layer bonds the electrode on the first surface of the ultraviolet light emitting element and a part of the mounting surface of the substrate;
   the fluororesin film is a flexible material configured to transmit ultraviolet light;

the substrate and the fluororesin film are disposed in a state where the ultraviolet light emitting element is sandwiched therebetween;

the fluorocarbon compound is a liquid at normal temperature and pressure; and the fluorocarbon compound fills a gap between the side surface of the ultraviolet light emitting element and the fluororesin film in a state of being in contact with the side surface and the fluororesin film, wherein an air layer comprising a closed space is disposed between the substrate and the ultraviolet light emitting element.

2. The ultraviolet light emitting device according to claim 1, wherein:

the fluorocarbon compound includes a side surface portion facing the side surface of the ultraviolet light emitting element;

the fluororesin film includes a side wall surface on a substrate side; and the side wall surface of the fluororesin film faces the side surface of the ultraviolet light emitting element in a state where the side surface portion of the fluorocarbon compound is sandwiched therebetween.

3. The ultraviolet light emitting device according to claim 2, wherein a thickness of the side surface portion of the fluorocarbon compound is smaller as a distance from the mounting surface of the substrate increases.

4. The ultraviolet light emitting device according to claim 1, wherein:

the fluorocarbon compound includes an upper surface portion facing the second surface of the ultraviolet light emitting element;

the fluororesin film includes a ceiling surface on the substrate side; and the ceiling surface of the fluororesin film faces the second surface of the ultraviolet light emitting element in a state where the upper surface portion of the fluorocarbon compound is sandwiched therebetween.

5. The ultraviolet light emitting device according to claim 1, wherein:

the fluororesin film includes a ceiling surface on the substrate side; and the ceiling surface of the fluororesin film is in contact with the second surface of the ultraviolet light emitting element.

6. The ultraviolet light emitting device according to claim 1, wherein the fluorocarbon compound fills a gap between the mounting surface of the substrate and the first surface of the ultraviolet light emitting element.

7. The ultraviolet light emitting device according to claim 1, wherein the fluorocarbon compound does not fill a gap between the mounting surface of the substrate and the first surface of the ultraviolet light emitting element.

8. The ultraviolet light emitting device according to claim 1, wherein:

the fluorocarbon compound contains a filler configured to transmit ultraviolet light; and the filler has a refractive index of 1.2 or more and 1.6 or less.

9. The ultraviolet light emitting device according to claim 1, further comprising:

an adhesive layer, wherein the adhesive layer adheres the mounting surface of the substrate and the fluororesin film, and is not present between the second surface of the ultraviolet light emitting element and the fluororesin film.

10. The ultraviolet light emitting device according to claim 1, wherein a refractive index of the fluorocarbon compound is greater than the refractive index of an atmosphere and equal to or less than the refractive index of the ultraviolet light emitting element, wherein the ultraviolet light emitting element, the second surface and the side surface from which the light is extracted to the outside are not in contact with the air layer having a lower refractive index.

11. An ultraviolet light emitting device comprising:

a substrate;

an ultraviolet light emitting element;

a bonding layer;

a fluororesin film; and a fluorocarbon compound, wherein:

the substrate is in at least partial contact with the ultraviolet light emitting element;

the ultraviolet light emitting element includes a first surface having an electrode, a second surface opposite to the first surface, and a side surface;

the bonding layer bonds the electrode on the first surface of the ultraviolet light emitting element and a part of the mounting surface of the substrate;

the fluororesin film is a flexible material configured to transmit ultraviolet light;

the substrate and the fluororesin film are disposed in a state where the ultraviolet light emitting element is sandwiched therebetween;

the fluorocarbon compound is a liquid at normal temperature and pressure; and the fluorocarbon compound fills a gap between the side surface of the ultraviolet light emitting element and the fluororesin film in a state of being in contact with the side surface and the fluororesin film, wherein an air layer filled with gas comprising a closed space is disposed between the substrate and the ultraviolet light emitting element.

12. The ultraviolet light emitting device according to claim 11, wherein:

the fluorocarbon compound includes a side surface portion facing the side surface of the ultraviolet light emitting element;

the fluororesin film includes a side wall surface on a substrate side; and the side wall surface of the fluororesin film faces the side surface of the ultraviolet light emitting element in a state where the side surface portion of the fluorocarbon compound is sandwiched therebetween.

13. The ultraviolet light emitting device according to claim 12, wherein a thickness of the side surface portion of the fluorocarbon compound is smaller as a distance from the mounting surface of the substrate increases.

14. The ultraviolet light emitting device according to claim 11, wherein:

the fluorocarbon compound includes an upper surface portion facing the second surface of the ultraviolet light emitting element;

the fluororesin film includes a ceiling surface on the substrate side; and the ceiling surface of the fluororesin film faces the second surface of the ultraviolet light emitting element in a state where the upper surface portion of the fluorocarbon compound is sandwiched therebetween.

15. The ultraviolet light emitting device according to claim 11, wherein:
the fluororesin film includes a ceiling surface on the substrate side; and
the ceiling surface of the fluororesin film is in contact with the second surface of the ultraviolet light emitting element.

16. The ultraviolet light emitting device according to claim 11, wherein
the fluorocarbon compound fills a gap between the mounting surface of the substrate and the first surface of the ultraviolet light emitting element.

17. The ultraviolet light emitting device according to claim 11, wherein
the fluorocarbon compound does not fill a gap between the mounting surface of the substrate and the first surface of the ultraviolet light emitting element.

18. The ultraviolet light emitting device according to claim 11, wherein:
the fluorocarbon compound contains a filler configured to transmit ultraviolet light; and
the filler has a refractive index of 1.2 or more and 1.6 or less.

19. The ultraviolet light emitting device according to claim 11, further comprising:
an adhesive layer, wherein
the adhesive layer adheres the mounting surface of the substrate and the fluororesin film, and is not present between the second surface of the ultraviolet light emitting element and the fluororesin film.

20. The ultraviolet light emitting device according to claim 11, wherein a refractive index of the fluorocarbon compound is greater than the refractive index of an atmosphere and equal to or less than the refractive index of the ultraviolet light emitting element,
wherein the ultraviolet light emitting element, the second surface and the side surface from which the light is extracted to the outside are not in contact with the air layer having a lower refractive index.

* * * * *